United States Patent [19]
Fjelstad

[11] Patent Number: 6,107,682
[45] Date of Patent: Aug. 22, 2000

[54] COMPLIANT WIREBOND PACKAGES HAVING WIRE LOOP

[75] Inventor: Joseph Fjelstad, Sunnyvale, Calif.

[73] Assignee: Tessera, Inc., San Jose, Calif.

[21] Appl. No.: 09/387,880

[22] Filed: Sep. 1, 1999

Related U.S. Application Data

[62] Division of application No. 08/989,368, Dec. 12, 1997, Pat. No. 5,989,939.
[60] Provisional application No. 60/033,354, Dec. 13, 1996.
[51] Int. Cl.[7] .......................... H01L 23/48; H01L 23/14; H01L 23/52; H01L 29/40; H01L 23/28
[52] U.S. Cl. .......................... 257/693; 257/696; 257/702; 257/773; 257/778; 257/779; 257/784; 257/787
[58] Field of Search .......................... 257/693, 696, 257/702, 773, 778, 779, 784, 787

[56] References Cited

U.S. PATENT DOCUMENTS

| | | |
|---|---|---|
| 4,764,848 | 8/1988 | Simpson . |
| 5,148,265 | 9/1992 | Khandros et al. . |
| 5,148,266 | 9/1992 | Khandros et al. . |
| 5,455,390 | 10/1995 | DiStefano et al. . |
| 5,476,211 | 12/1995 | Khandros . |
| 5,801,446 | 9/1998 | DiStefano . |
| 5,806,181 | 9/1998 | Khandros . |
| 5,829,128 | 11/1998 | Eldridge et al. . |

FOREIGN PATENT DOCUMENTS

95/14314  5/1995  WIPO .

*Primary Examiner*—David E. Graybill
*Attorney, Agent, or Firm*—Lerner, David, Littenberg, Krumholz & Mentlik, LLP

[57] ABSTRACT

A semiconductor chip assembly with a frame having an aperture, a continuous rail enclosing the aperture and bonds pads disposed on the top surface of the continuous rail; a semiconductor chip having contacts on its top surface fitted within the aperture; a plurality of wire loops connecting the bond pads to the contacts, and a compliant layer disposed over the first surface of the semiconductor chip and the plurality of wire loops such that the top portion of each wire loop is exposed. The semiconductor chip assembly can be incorporated into a larger assembly by connecting the wire loops to connection pads on an external substrate.

21 Claims, 7 Drawing Sheets

COMPLIANT WIREBOND PACKAGES HAVING WIRE LOOP

CROSS REFERENCE TO RELATED APPLICATIONS

The present application is a divisional application of U.S. patent application Ser. No. 08/989,368, filed Dec. 12, 1997, U.S. Pat. No. 5,989,939, which in turn claims benefit of U.S. Provisional Patent Application Ser. No. 60/033,354, filed on Dec. 13, 1996, the disclosure of which is hereby incorporated by reference herein.

FIELD OF THE INVENTION

The present invention relates to art of electronic packaging and more specifically to electronic packages containing wire loops and methods of making the same.

BACKGROUND OF THE INVENTION

Modern electronic devices utilize integrated circuits, commonly referred to as semiconductor chips that incorporate numerous electronic elements. These chips are typically mounted on support substrates such as circuit panels or chip carriers. The substrates physically support the chips and electrically interconnect each chip with other elements of the circuit. The interconnection between the chip and the chip carrier is commonly referred to as "first level" assembly or chip interconnection, as distinguished from the interconnection between the chip carrier and the larger elements of the circuit, commonly referred to as "second level" interconnection.

The structures utilized to provide the first level connection between the chip and the substrate must accommodate all of the required electrical interconnections to the chip. The number of connections to external circuit elements, commonly referred to as "input-output" or "I/O" connections, is determined by the structure and function of the chip. Advanced chips capable of performing numerous functions may require substantial number of I/O connections.

The size of the chip and substrate assembly is a major concern. The size of each such assembly influences the size of the overall electronic device. Moreover, the size of each assembly controls the required distance between each chip and other chips, or between each chip and other elements of the circuit. Delays in transmission of electrical signals between chips are directly related to these distances. These delays limit the speed of operation of the device. For example, in a computer where a central processing unit operates cyclically, signals must be interchanged between the central processing unit chip and other chips during each cycle. The transmission delays inherent in such interchanges often limit the cycling rate of the central processing chip. Thus, more compact interconnection assemblies, with smaller distances between chips and smaller signal transmission delays which permit faster operation of the central processing chip, can be made.

The first level interconnection structures connecting a chip to a substrate ordinarily are subject to substantial strain caused by thermal cycling as temperatures within the device change during operation. The electrical power dissipated with the chip tends to heat the chip and the substrate, so that the temperatures of the chip and the substrate rise each time the device is turned on and fall each time the device is turned off. Over a period of time, the device tends to undergo a number of heating up and cooling down cycles as the device is repeatedly turned on and off. These cycles, which cause an associated expansion and contraction of the device, are commonly referred to as "thermal cycling". As the chip and the substrate are ordinarily are formed from different materials, having different coefficients of thermal expansion, the chip and the substrate ordinarily expand and contract by different amounts. This causes the electrical contacts on the chip to move relative to the electrical contact pads on the substrate as the temperature of the chip and the chip modules change. This relative movement deforms the electrical interconnections between the chip and the substrate and places them under mechanical stress. These stresses are applied repeatedly with repeated operations of the device, and can cause breakage of the electrical interconnections. Thermal cycling stresses may occur even where the chip and the substrate are formed from like materials having similar coefficients of thermal expansion, because the temperature of the chip may increase more rapidly than the temperature of the substrate when power is first applied to the chip.

Semiconductor chips typically have been connected to electrical conductors on mounting substrates such as chip carriers or circuit panels by methods such as wire bonding, tape automated bonding, and flip-chip bonding. In wire bonding, the chip is positioned on the substrate with the bottom or back surface of the chip abutting the substrate and with the contact-bearing front or top surface of the chip facing upwardly, away from the substrate. Individual fine wires are connected between the contacts on the chip and the contact pads of the substrate. There are reliability issues with wire bonded leads breaking during thermal cycling due to the CTE mismatch. In chip on board packaging, the chip may be wire bonded directly to a printed circuit board. This is typically referred to 1½ level packaging. One of the reliability issues in this packaging scheme is known good die. Until the chip is wire bonded to the circuit board and the circuit board is tested, it is generally difficult to determine whether the chip is defective. The cost of replacing a defective chip is generally quite substantial. It is therefore, preferable to package a chip such that it is testable prior to being incorporated into an electronic device.

In tape automated bonding, a flexible dielectric tape bearing a prefabricated array of leads is positioned over the chip and substrate, and the leads are bonded to the contacts of the chip and to pads of the substrate. Tape bonded leads suffer from reliability issues related to thermal cycling induced lead breakage.

In flip-chip bonding, contacts on the surface of the chip are provided with bumps of solder. The substrate has pads arranged in an array corresponding to the array of contacts on the chip. The chip, with the solder bumps, is inverted so that its front surface faces towards the top surface of the substrate, with each contact and solder bump on the chip being positioned on the appropriate pad of the substrate. The assembly is then heated so as to liquefy the solder and bond each contact on the chip to the confronting pad of the substrate. A compact assembly can be made using flip-chip technology because flip-chip bonding does not require the leads to be arranged in a fan-out pattern. The area of the substrate occupied by the pads is approximately the same size as the chip itself. Having a package that is approximately the same size as the chip itself is highly desirable because such packages can be used to reduce the overage size of the electronic device. Assemblies made by flip-chip bonding, however, are susceptible to thermal stresses. The problem is particularly pronounced with relatively large chips.

Packaging technologies which address the issues of package size, package speed, are thermal stress are desired.

Commonly assigned U.S. Pat. Nos. 5,148,266 and 5,148,265, the disclosures of which are hereby incorporated by reference herein, provide substantial solutions to theses problems of thermal stresses and package size. Additional and/or alternative package methods to address these needs are desired. The present invention provides an alternative package addressing the problems of package size, signal speed and thermal stresses.

SUMMARY OF THE INVENTION

One aspect of the present invention provides a semiconductor chip assembly which includes a frame having pad support element with a top surface and a plurality of bond pads disposed on the top surface. The assembly also includes a semiconductor chip that is disposed alongside of the pad support element. For example, the frame may define an aperture and the pad support element may be an elongated rail extending alongside the aperture on one or more sides thereof. Preferably, the rail is a continuous rail enclosing the aperture, and the chip may be disposed in the aperture. The chip has a first or top surface and a plurality of contacts that are disposed on the first surface. The assembly also has a plurality of wire loops. Each wire loop has a contact end connected to one of the contacts, a bond pad end connected to one of the bond pads and a top portion between the contact end and the bond pad end. The assembly further includes a compliant layer. The compliant layer covers the first surface of the semiconductor chip, the top surface of the pad support element, and most of each of the wire loops. A top portion of each of the wire loops protrudes above and out of the compliant layer. The assembly optionally includes a plurality of terminals disposed on the top surface of the compliant layer. Each of the terminals corresponds to one of the wire loops and is in electrical contact with such corresponding wire loop. The assembly of this aspect of the invention may be incorporated into a larger assembly by bonding the terminals or the exposed wire top portions of the wire loops to connection pads on a support substrate within the larger assembly.

The assembly of this aspect of the invention may be made by providing the frame and assembling the semiconductor chip with the frame so that the chip is disposed alongside the pad support element. Where the pad support element is a rail disposed adjacent an aperture in the frame, the chip may be placed into the aperture of the frame. A plurality of wire loops is then formed. Each of the wire loops connects one of the contacts to the corresponding bond pad. A compliant layer is then formed over the semiconductor chip by dispensing a compliant material over the first surface of the semiconductor chip and the top surface of the pad support element. The compliant layer should completely cover the first surface of the chip, and should cover at least a significant portion of each wire loop. If each wire loops is completely covered with the compliant material and is therefore completely immersed within the compliant layer, then material is removed from the top surface, for example by etching the top surface of the compliant layer, to expose the top portion of each of the wire loops. If the compliant material is curable, it is generally cured before the removing step. The completed assembly may be mounted on a circuit panel at this point. The wire loops may be used to connect the completed assembly to the circuit panel, as by bonding the exposed top portions of the wire loops to contact pads on the circuit panel.

In an alternative arrangement, terminals may be formed on the compliant layer of the assembly after the etching step. The terminals may be formed using, for example, conventional photolithographic methods. Generally, the terminals may be formed by first coating the compliant layer with a metal, using a suitable deposition process such as electroless deposition, sputtering and plating, or chemical vapor deposition, to form a metallic layer. A photoresist can then be coated over the metallic layer. The photoresist is exposed and developed such that the metal below is protected in areas where the terminals will be formed and unprotected in the other areas. The undeveloped photoresist is removed by exposing the assembly to a stripping solution. The metal in the unprotected areas is then removed leaving a plurality of terminals wherein each such terminal is electrically connected to one of the wire loops. Generally, the developed photoresist is then removed from the assembly.

The present invention also provides a semiconductor assembly that is frame-less and which includes a plurality of wire loops; and a method of making such an assembly. The semiconductor chip assembly of this aspect of the invention includes a semiconductor chip having a first surface. A plurality of contacts and a plurality of bond pads are disposed on the first surface. The assembly also has a plurality of wire loops. Each wire loop has a contact end connected to one of the contacts, a bond pad end connected to one of the bond pads and a top portion between the contact end and the bond pad end. Preferably, each of the contacts corresponds to one of the bond pads, and each wire loop is connected between one contact and bond pad corresponding to that contact. The assembly further includes a compliant layer. The compliant layer covers the first surface of the semiconductor chip and a portion of each of the wire loops. The top portion of each of the wire loops is exposed at the top of the compliant layer. Thus, the wire loops may protrude above and out of the compliant layer. The assembly may also include a plurality of terminals disposed on the top surface of the compliant layer. Each of the terminals corresponds to one of the wire loops and is in electrical contact with such corresponding wire loop. The assembly of this aspect of the invention may be incorporated into a larger assembly by bonding the terminals or the exposed wire top portions of the wire loops to connection pads on a support substrate within the larger assembly.

The assembly of this aspect of the invention may be made by providing a semiconductor chip having a plurality of contacts and corresponding bond pads disposed on its first surface. A plurality of wire loops are then formed by connecting each of the contacts to the corresponding bond pad using a thin wire. A compliant layer is then formed over the semiconductor chip by dispensing a compliant material over the first surface of the semiconductor chip. The compliant layer should completely cover the first surface and should cover at least a significant portion of each wire loop. If each wire loop is completely covered with the compliant material and is therefore completely immersed within the compliant layer, then material is removed from the top surface of the compliant layer, as by etching the compliant layer, to expose the top portion of each of the wire loops. If the compliant material is curable, it may be cured before, during, or after the removal step, but it is typically cured prior to the removal step. After the removal step, terminals may be formed on the compliant layer using, for example, the photolithographic methods described above.

Thus, the various assemblies discussed above can be made by a process which includes the steps of providing a component including a semiconductor chip having a first surface and a plurality of contacts disposed on the first surface; forming a plurality of wire loops connected to the contacts on the chip so that the wire loops project upwardly from the first surface of the chip and have top portions disposed above the first surface; forming a compliant layer over the first surface of the semiconductor chip by dispensing a compliant material on the first surface of the semiconductor chip and the plurality of wire loops; and exposing the top portions of the wire loops at a primary surface of the compliant layer remote from the top surface of the chip. In the processes discussed above using the frame, the component includes the chip and the frame, whereas in the frameless processes discussed above, the component may consist of the chip alone.

DETAILED DESCRIPTION OF THE PREFERRED EMBODIMENTS

A semiconductor chip assembly in accordance with one embodiment of the present invention is shown in progressive stages of production in FIGS. 1–6. As depicted in FIG. 1A, the assembly 12 includes a frame 1 having a pad support element in the form of a continuous rail 3 that encloses an aperture 2. In an alternative embodiment, frame 1 may be a laminate construction comprised of a continuous rail and a dielectric substrate layer. The continuous rail may include a stiffener layer. The frame may also include a stiffener layer such as a metal plate, as is depicted in FIG. 1C, or another conductive material or it may be made of a non-conducting material. If the laminate construction has a dielectric substrate layer, this layer is under the central aperture. If the frame is comprised of both a stiffener layer and a dielectric substrate layer, most of the thickness of the frame may be in the stiffener layer. In an alternative embodiment, and as depicted in Fig. 1B, the frame may comprise a solid unlaminated non-conductive material.

Figure 1A:
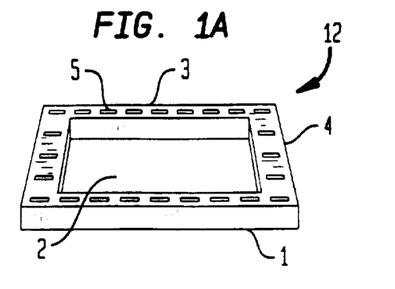
FIG. 1A is a diagrammatic perspective view of a frame of the semiconductor chip assembly of the present invention.
Figure 1B:
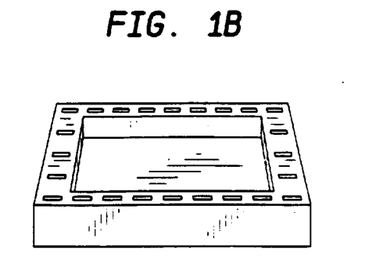
FIG. 1B is a diagrammatic perspective view of another frame of the semiconductor chip assembly of the present invention.
Figure 1C:
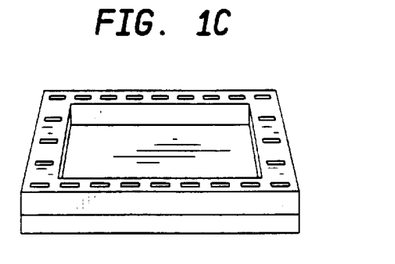
FIG. 1C is a diagrammatic perspective view of another frame of the semiconductor chip assembly of the present invention.

Aperture 2 is preferably centralized within frame 1 and sized such that a semiconductor chip will fit snugly into the aperture. The continuous rail 3 has a top surface 4 and a plurality of bond pads 5 disposed on the top surface 4. Each bond pad is bondable using wire bond methods. Typically, each bond pad is electrically conductive and is electrically isolated from the other bond pads. Other electrical and electronic elements, such as capacitors to reduce cross talk, may also be disposed on or in rail 3, and electrically interconnected with the bond pads.

Figure 2:
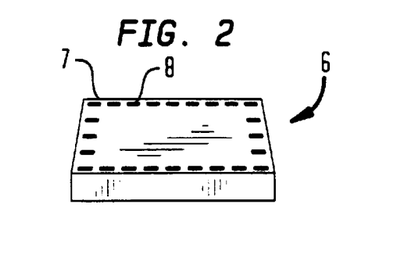
FIG. 2 is a diagrammatic perspective view of a semiconductor chip for use in the semiconductor chip assembly of the present invention.
Figure 3A:
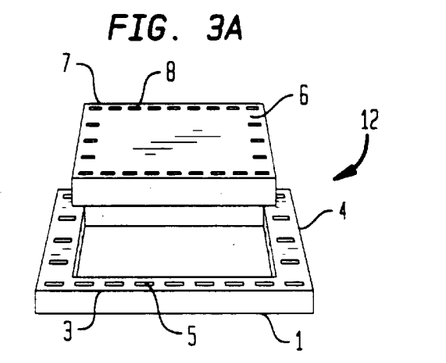
FIG. 3A is a diagrammatic perspective view of a frame and semiconductor chip for use in the semiconductor chip assembly of the present invention.
Figure 3B:
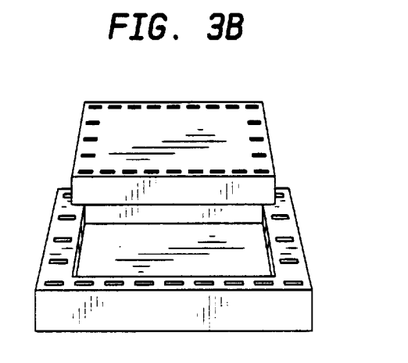
FIG. 3B is a diagrammatic perspective view of another frame and semiconductor chip for use in the semiconductor chip assembly of the present invention.
Figure 3C:
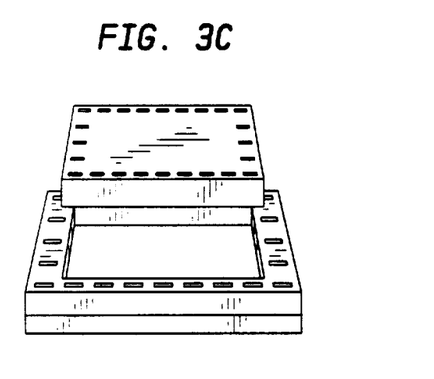
FIG. 3C is a diagrammatic perspective view of another frame and semiconductor chip for use in the semiconductor chip assembly of the present invention.
Figure 4:
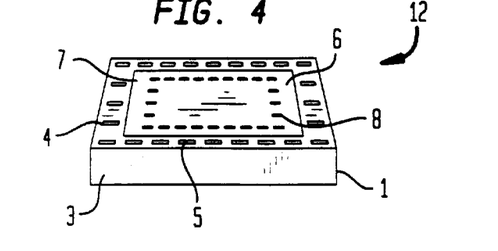
FIGS. 4–6 are diagrammatic perspective views of one embodiment of the semiconductor chip assembly of the present invention in progressive stages of production.

A semiconductor chip for use in the present semiconductor chip assembly is depicted in FIG. 2. Semiconductor chip 6 has a first surface 7 and a plurality of contacts 8 disposed on the first surface. Each of the contacts is bondable using wire bond methods. In preferred embodiments, the contacts are electrically conductive and electrically isolated from one another. As depicted in FIGS. 3A, 3B, and 3C, in preferred embodiments, aperture 2 is sized such that a semiconductor chip will fits snugly within the aperture. Semiconductor chip 6 is placed in aperture 2, as depicted in FIG. 4. The chip is received in the aperture, with the first surface 7 of the chip facing upwardly, in the same direction as the top surface 4 of the pad support element or rail. Preferably, the top surface 4 of the pad support element is coplanar with the first surface 7 of the semiconductor chip. Thus, the rail or pad support element 3 extends alongside the chip, adjacent each edge of the chip.

Figure 5:
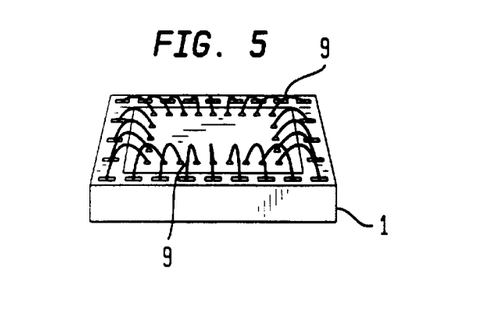

As depicted in FIG. 5, a plurality of wire loops 9 is then formed. Each wire loop 9 is formed by bonding a thin wire to a contact 8 and a corresponding bond pad 5. In preferred embodiments, the wire loops are formed using a conventional capillary wire bonding machine. The process for performing such wire bonding is generally disclosed in U.S. Pat. No. 5,455,390, the disclosure of which is hereby incorporated by reference in its entirety herein. Each wire loop is comprised of a contact end, a bond pad end and a top portion. The contact end is connected to a contact. The bond pad end is connected to the corresponding bond pad. The top portion extends upwardly, away from the top surfaces of the chip and rail between the contact end and the bond pad end.

The top surface of the rail, the first surface of the semiconductor chip and the wire loops are then covered with a compliant material to form a compliant layer. Suitable compliant materials include flexiblized epoxies and silicones. The compliant material is generally applied in an uncured state and then later cured. The compliant material may be carefully dispensed to insure that entire top surface of the rail and the entire first surface of the semiconductor chip are covered and that only a portion of each wire loop is covered with the compliant material. In this case, the dispensing operation used to apply the compliant material must be controlled such that the top portion of each wire loop is not covered or contaminated with the compliant material, and the top portions are left exposed upon formation of the compliant layer. For example, the amount of material applied may be controlled. Alternatively or additionally, the top portions of the wire loops may be engaged by a platen formed from a relatively soft material such as a polymer or by a platen having recesses adapted to engage the top portions of the wire loops, and the compliant material may be applied around the wire loops while the top portions are engaged with the platen. The platen thus prevents the compliant material from covering the top portions of the wire loops.

Figure 6:
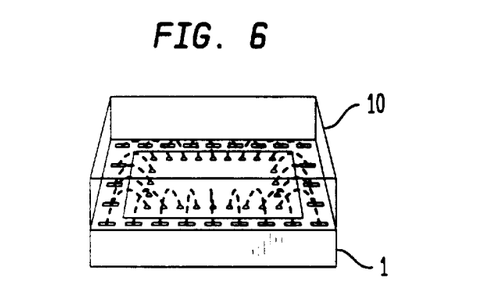

In an alternative method and as depicted in FIG. 6, a sufficient quantity of compliant material may be dispensed to insure that the entire structure of each wire loop, as well as the top surface of the pad support element or rail and the first surface of the semiconductor chip are completely encapsulated with the compliant material. The complaint material can then be cured to form a compliant layer 10.

Figure 7:
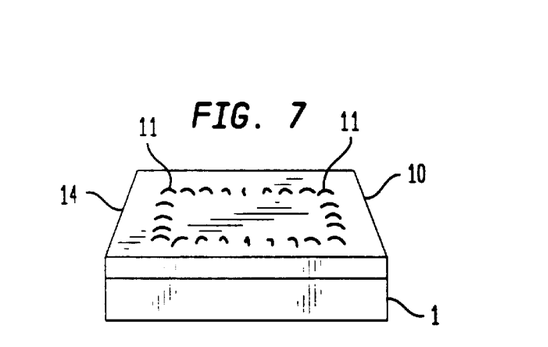
FIGS. 7–12 are diagrammatic perspective views of another embodiment of the semiconductor chip assembly of the present invention in progressive stages of production.

As depicted in FIG. 7, the compliant layer can then be partially removed to expose the top portions 11 of each of the wire loops 9. Any suitable method of removal may be used. Preferably, the partial removal step is performed by etching the compliant layer. If the compliant material is made from a flexiblized epoxy, then the preferred etching method is plasma etching. In an alternative embodiment, a part of the compliant material is removed, as by etching or other removal processes, before the compliant material is cured to form the compliant layer. In this embodiment, the compliant material is cured to form a compliant layer after the compliant material is etched.

Figure 21:
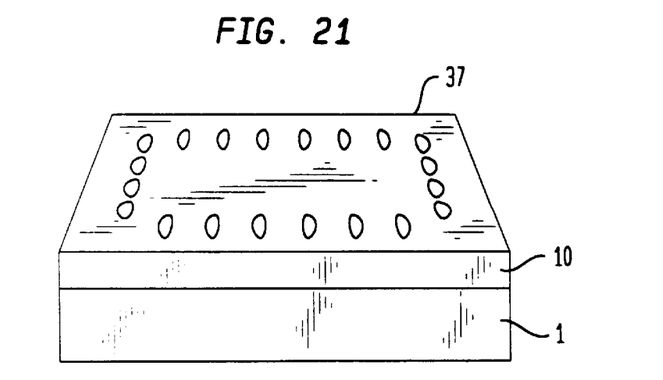
FIG. 21 is a diagrammatic perspective view of another embodiment of the semiconductor chip assembly of the present invention.
Figure 22:
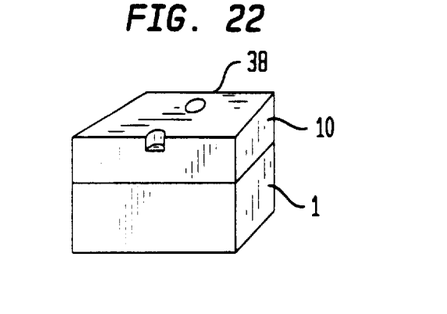
FIG. 22 is an enlarged section of a diagrammatic perspective view of one embodiment of the present invention.
Figure 23:
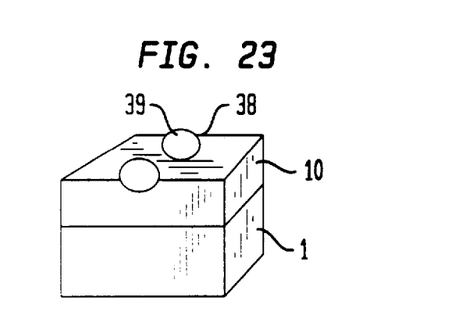
FIG. 23 is an enlarged section of a diagrammatic perspective view of another embodiment of the present invention.

The semiconductor chip assembly of FIG. 7 can be incorporated in a larger circuit assembly by bonding the exposed top portions 11 of wire loops 9 to connection pads on an external support substrate using a plurality of joining units, such as conductive adhesive, solder, or any other suitable bonding method. A semiconductor chip assembly with conductive adhesive 37 deposited on each of the wire loops is depicted in FIG. 21. In an alternative embodiment, the compliant material from the compliant layer may be removed in area adjacent to each top portion of each wire loop, as depicted in FIG. 22, to form a plurality of troughs 38 in the complaint layer 10. A preferred method of forming troughs 38 is using a laser to laser ablate the top or primary surface of the compliant layer 10, i.e., the surface of the compliant layer facing away from the chip and frame. As depicted in FIG. 23, a solder ball 39 may be placed in each trough 38. The assembly can be connected to connection pads on a substrate using solder balls 39.

Figure 8:
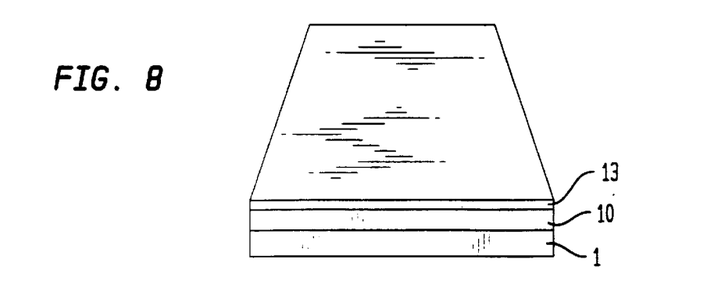
Figure 9:
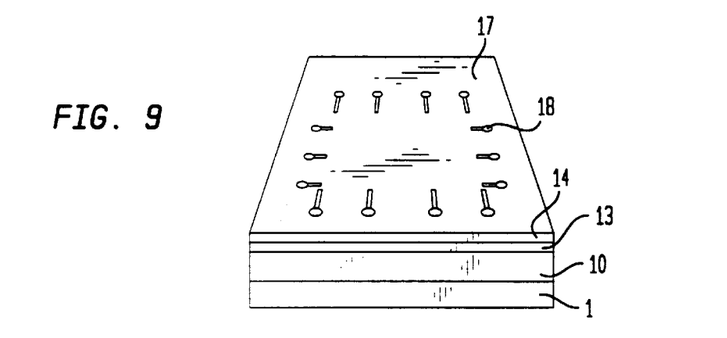
Figure 10:
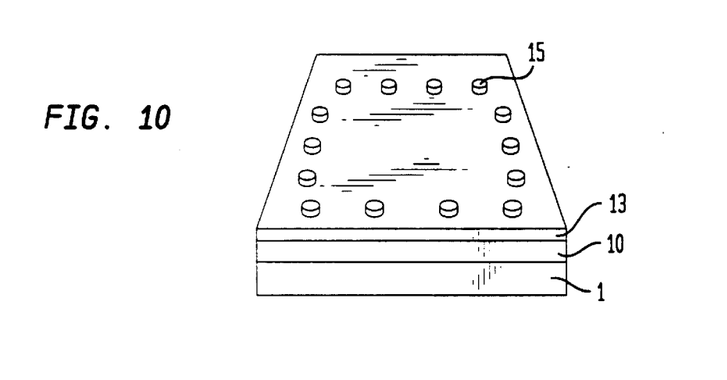
Figure 11:
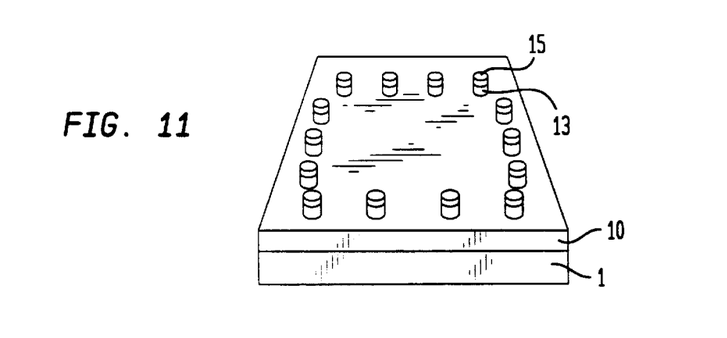
Figure 12:
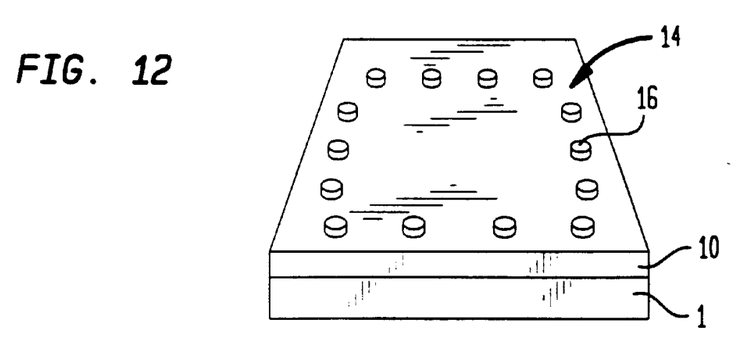

In an alternative embodiment, the semiconductor chip assembly may be connected to a support substrate using terminals disposed on the primary surface of the compliant layer. A method of making a semiconductor assembly including terminals on the primary surface of the compliant layer is depicted in FIGS. 1 🕮 12. In this method, the assembly according to the steps described above and depicted in FIGS. 1–7 is prepared. The assembly is further processed as described below and depicted in FIGS. 8–12. As depicted in FIG. 8, a metallic layer 13 may be disposed over the primary surface 14 of compliant layer 10. The metallic layer may formed, for example, by laminating a sheet of metal over the compliant layer, or depositing a layer of metal via electroplating, electroless plating or chemical vapor deposition. Electroplating, electroless plating and chemical vapor deposition are preferred methods of forming the metallic layer. The metallic layer 13 must be in electrical contact with the plurality of wire loops 9. As depicted in FIG. 9, a photoresist is disposed over the metal layer 13 to form a photoresist layer 14. The photoresist is selectively exposed to illumination and developed so as to leave undeveloped photoresist in a first section 17 and developed photoresist in a plurality of second sections 18. The undeveloped photoresist is then removed to leave a plurality of developed photoresist sections or spots 15 and expose the remainder of layer 13, as depicted in FIG. 10. The assembly is then contacted with an etching or stripping solution to remove the exposed metal. Once the exposed metal is etched away, as depicted in FIG. 11, the assembly has a plurality of developed photoresist sections 15, each of which overlies what remains of the metallic layer 13. As depicted in FIG. 12, the developed photoresist sections 15 are then removed leaving a plurality of terminals 16 disposed on the primary surface 14 of the compliant layer 10. Each of the terminals corresponds to and is electrically connected to one of the wire loops.

Each of the terminals may be disposed on the corresponding wire loop or may be fanned in or fanned out from the corresponding wire loop. In a "fan-in" arrangement, the wire loops are generally disposed over the periphery of the chip. The terminals are disposed on the compliant layer inside the region that is bounded by the top portions of the wire loops. If the terminals are electrically connected to the wire loops using electrically conductive traces, then the traces fan inwardly of the wire loops.

In a "fan-out" arrangement, the wire loops are again generally disposed over the periphery of the chip. The terminals are disposed on the compliant layer outside the region that is bounded by the top portions of the wire loops. If the terminals are electrically connected to the wire loops using electrically conductive traces, then the traces fan outwardly of the wire loops. In a "fan-in/fan-out" arrangement, some terminals are disposed inside the region bounded by the top portions of the wire loops and some are disposed outside the region. Some leads, therefore, fan-in and some fan-out. The traces may be formed integrally with the terminals, during the same steps used to from the terminals. Where traces are employed, each terminal may have a trace extending between the terminal and one of the wire loops. The terminals are typically disposed in single rows and columns on the compliant layer, but may be disposed in a so called "area array", a grid like array on the primary surface of the compliant layer. A conductive adhesive, solder balls, solder or any other suitable bonding method may be used to bond each terminal to the corresponding connection pad on the support substrate.

Before or during the process in which the metallic layer is disposed on the compliant layer, the exposed top portions of the wire loops may be bent over and pushed into the surface of the complaint layer resulting in a smooth layer over which the metallic layer may be disposed. The exposed top portions may be bent individually or simultaneously. If the wire loops are bent simultaneously using a planar tool such as a flat platen, the high points of the wire loops may be planarized, resulting in a planar package which can more easily be incorporated into a larger assembly. The bend introduced into each of the wire loops in this step may be transverse to the plane of the loop. This provides additional flexibility in the wire loop.

Figure 13:
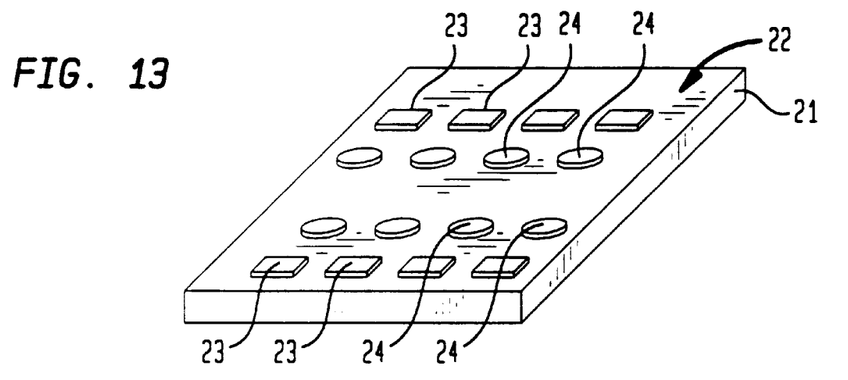
FIGS. 13–16 are diagrammatic perspective views of another embodiment of the semiconductor chip assembly of the present invention in progressive stages of production.

A semiconductor chip assembly in accordance with another embodiment of the present invention is shown in progressive stages of production in FIGS. 13–16. As depicted in FIG. 13, the assembly includes a semiconductor chip 21 having a first surface 22. A plurality of contacts 23 are disposed on the first surface 22. A plurality of bond pads 24 is also disposed on the first surface 22. Each of the bond pads 24 corresponds to one of the contacts 23. Typically, bond pads would be provided as part of the chip itself, and the circuitry within the chip would be designed taking account of the bond pads and the wire bonding operations to be performed. For example, the chip may be designed so that those parts of the chip immediately beneath the bond pads will not include components which may be damaged by the wire bonding operation. In this respect, the chip design considerations associated with the bond pads are similar to the considerations associated with the wire-bondable contacts on the chip. The internal circuitry of the chip (not shown) may electrically connect the bond pads 24 to electronic components within the chip. Thus, the bond pads, as well as the contacts, may be used as I/O connections to the chip.

Figure 14:
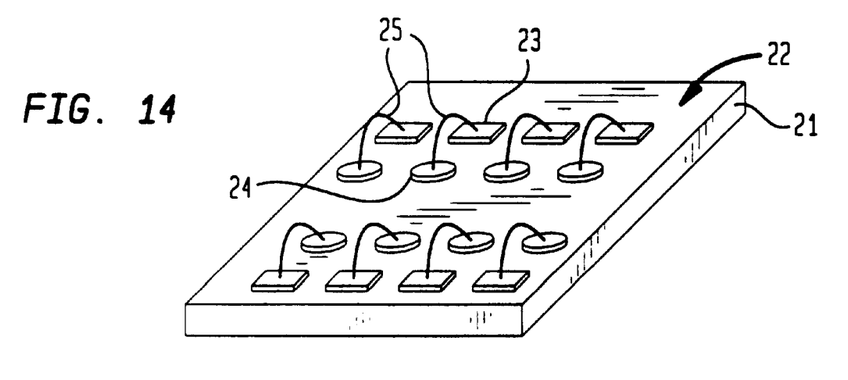

As depicted in FIG. 14, a plurality of wire loops 25 are formed which connect each contact 23 to the corresponding bond pad 24. Each wire loop 25 is formed by bonding a thin wire to a contact 23 and a corresponding bond pad 24. In preferred embodiments, the wire loops are formed using a conventional capillary wire bonding machine, as discussed above. Each wire loop is comprised of a contact end, a bond pad end and a top portion. The contact end is connected to a contact. The bond pad end is connected to the corresponding bond pad. The top portion is between the contact end and the bond pad end.

The first surface 22 of the semiconductor chip 21 and the wire loops 25 are covered with a compliant material to form a compliant layer 26. Suitable compliant materials are described above and include flexiblized epoxies and silicones. The compliant material is generally applied in an uncured state and then later cured. The compliant material may be carefully dispensed to insure that entire first surface of the semiconductor chip is covered and that only a portion of each wire loop is covered with the compliant material. In this case, the dispense of the compliant material must be controlled such that the top portion of each wire loop is not covered or contaminated with the compliant material.

Figure 15:
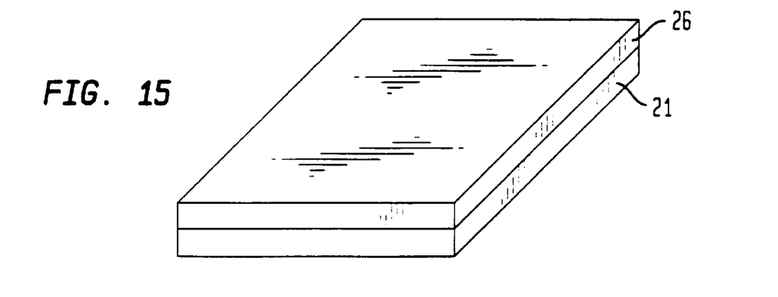

In an alternative method and as depicted in FIG. 15, a sufficient quantity of compliant material may be dispensed to insure that the entire structure of each wire loop 25, as well as the first surface 22 of the semiconductor chip 21 are completely encapsulated with the compliant material. The complaint material can then be cured to form a compliant layer 26.

Figure 16:
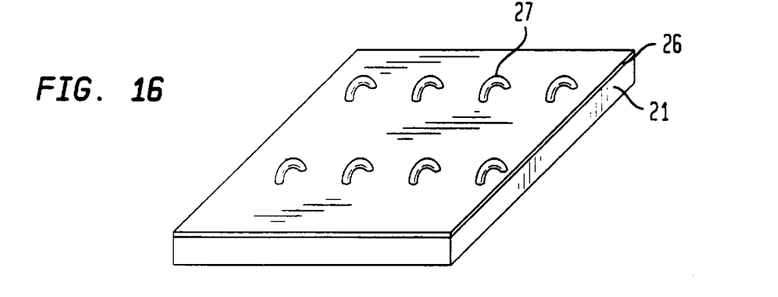

As depicted in FIG. 16, the compliant layer 26 can then be etched or otherwise partially removed to expose the top portions 27 of each of the wire loops 25. Any suitable etching method may be used to etch the compliant layer. If the compliant material is made from a flexiblized epoxy, then the preferred etching method is plasma etching. The compliant material may be cured before, during, or after the partial removal step, but in preferred embodiments the compliant material is etched after it is cured to form the compliant layer.

The semiconductor chip assembly 12 of FIG. 16 can be incorporated in a larger circuit assembly by bonding the exposed top portions 27 of wire loops 25 to connection pads on an external support substrate using a conductive adhesive, solder, or any other suitable bonding method.

In an alternative embodiment, the semiconductor chip assembly may be connected to a support substrate using terminals disposed on the primary surface of the compliant layer. Here again, the terminals may directly overlie the wire loops, or may be connected to the wire loops by conductive traces. A method of disposing terminals on the primary surface of the compliant layer is described above.

As described in more detail above, the exposed top portions of the wire loops may be bent over, pushed into the surface of the complaint layer and planarized; resulting in a planar package which can more easily be incorporated into a larger assembly.

Figure 17:
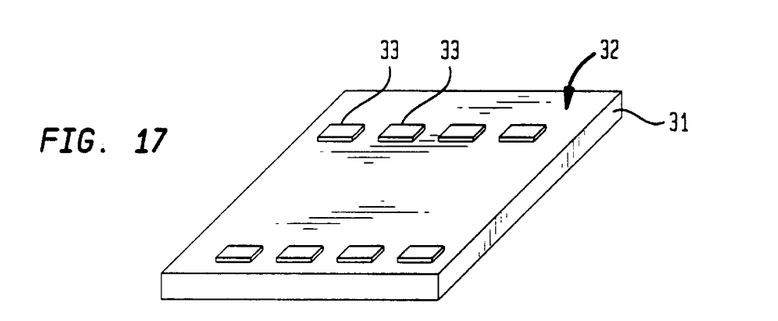
FIGS. 17–20 are diagrammatic perspective views of another embodiment of the semiconductor chip assembly of the present invention in progressive stages of production.

A semiconductor chip assembly in accordance with another embodiment of the present invention is shown in progressive stages of production in FIGS. 17–20. The semiconductor chip assembly described in the immediately preceding paragraphs is frame-less and has a plurality of wire loops. The ends of each wire loop are connected to a contact and a corresponding bond pad. In contrast, both ends of each wire loop of the semiconductor chip assembly of FIGS. 17–20 are connected to a single contact. As depicted in FIG. 17, the assembly includes a semiconductor chip 31 having a top surface 32. A plurality of contacts 33 is disposed on the top surface 32.

Figure 18:
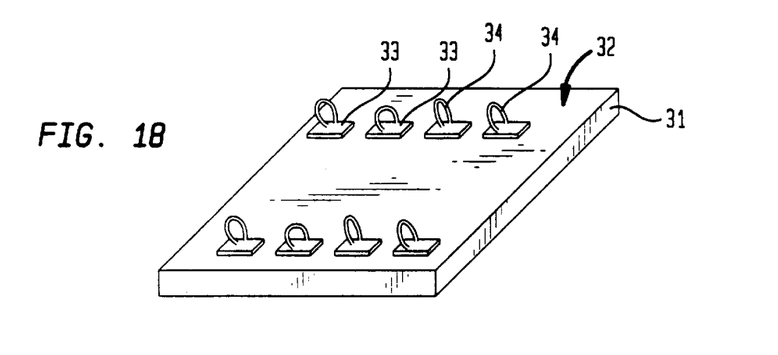

A plurality of wire loops 34 is formed. As depicted in FIG. 18, each wire loop is a thin wire having a first contact end a second contact end, and a top portion therebetween. Each wire loop 34 is formed by bonding a first contact end to a contact 33 and then bonding the second contact end of the same wire loop 34 to the same contact 33. In preferred embodiments, the wire loops are formed using a conventional capillary wire bonding machine, as discussed above.

The first surface 32 of the semiconductor chip 31 and the wire loops 34 are then covered with a compliant material to form a compliant layer 35. Suitable compliant materials include flexiblized epoxies and silicones. The compliant material is generally applied in an uncured state and then later cured. The compliant material may be carefully dispensed to insure that entire first surface of the semiconductor chip is covered and that only a portion of each wire loop is covered with the compliant material. In this case, the dispense of the compliant material must be controlled such that the top portion of each wire loop is not covered nor contaminated with the compliant material.

Figure 19:
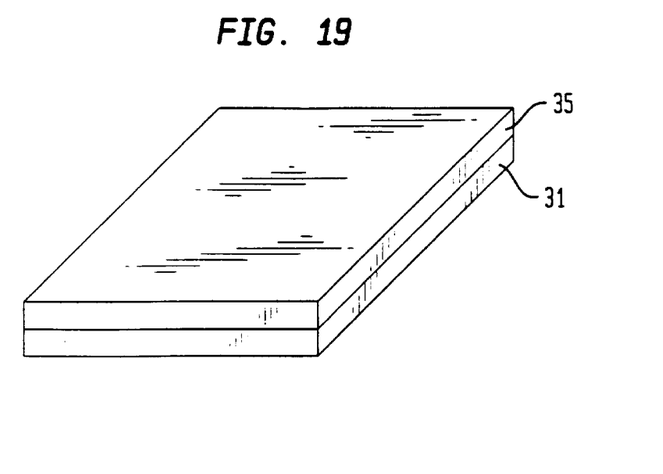

In an alternative method and as depicted in FIG. 19, a sufficient quantity of compliant material may be dispensed to insure that the entire structure of each wire loop 34, as well as the first surface 32 of the semiconductor chip 31 are completely encapsulated with the compliant material. The complaint material can then be cured to form a compliant layer 35.

Figure 20:
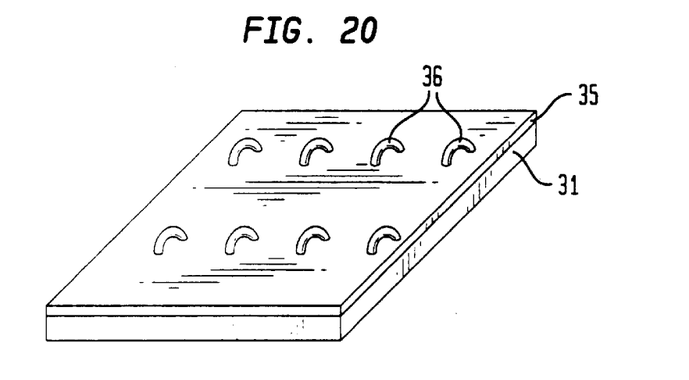

As depicted in FIG. 20, the compliant layer 35 can then be etched or otherwise partially removed to expose the top portions 36 of each of the wire loops 34. Any suitable etching method may be used to etch the compliant layer. If the compliant material is made from a flexiblized epoxy, then the preferred etching method is plasma etching. In an alternative embodiment, the compliant material is partially removed before it is cured to form the compliant layer. In this embodiment, the compliant material is cured to form a compliant layer after the compliant material is etched.

The semiconductor chip assembly of FIG. 20 can be incorporated in a larger circuit assembly by bonding the exposed top portions 36 of wire loops 34 to connection pads on an external support substrate using a conductive adhesive, solder, or any other suitable bonding method.

In an alternative embodiment, the semiconductor chip assembly may be connected to a support substrate using terminals disposed on the primary surface of the compliant layer, with or without traces connecting the terminals to the wire loops. A method of making a semiconductor assembly including terminals on the primary surface of the compliant layer is described above.

As described in more detail above, the exposed top portions of the wire loops may be bent over, pushed into the surface of the complaint layer and planarized, resulting in a planar package which can more easily be incorporated into a larger assembly.

Figure 24:
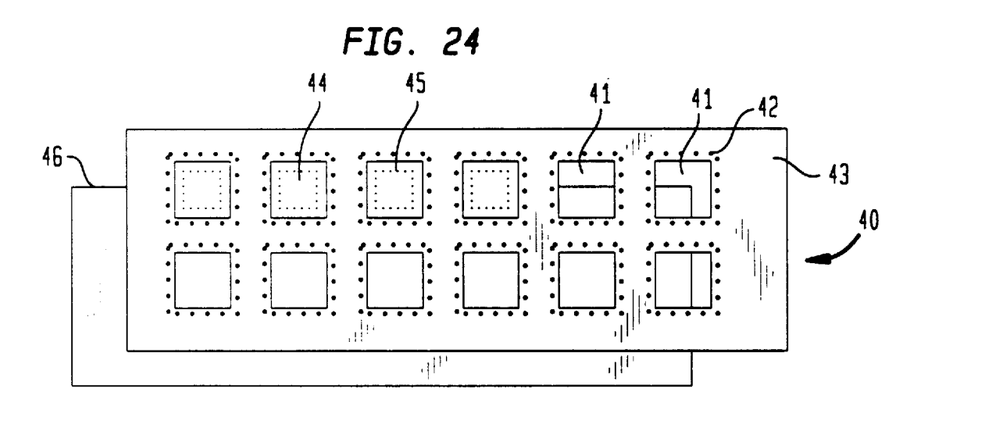
FIG. 24 is a top view of one embodiment of the present invention.

As depicted in FIG. 24, a plurality of semiconductor chip assemblies can be manufactured simultaneously. In such a method, a master frame 40 contains a plurality of apertures 41. Surrounding each aperture 41 is a plurality of bond pads 42 disposed on the top surface 43 of the master frame 40. The master frame is placed on a release liner 46 for processing. A semiconductor chip 44 is placed within each aperture 41. Each semiconductor 44 has a plurality of contacts 45 disposed on its first surface. A plurality of wire loops are then formed. A complaint material is then disposed over the top surface of the master frame and the first surfaces of the semiconductor chips. After the compliant material is cured to form a compliant layer, the primary surface of the complaint layer is etched to expose the top portion of each wire loop. The master frame can then be cut apart or "singulated" into a plurality of semiconductor chip assemblies, each including one or more of the chip and the adjacent parts of the frame.

In other embodiments of the invention, removal processes other than the ablation and etching processes discussed above may be employed. For example, if the compliant material is soluble in a liquid solvent, material may be removed from the compliant layer by exposing the primary surface of the compliant layer to such solvent, before or after cure. Also, the processes used to deposit metallic terminals on the primary surface of the compliant layer may be varied. For example, a so-called "lift-off" plating process may be employed. In the lift-off process, the photoresist layer is applied over the primary surface of the compliant layer. This layer is selectively illuminated and developed to form openings in areas where metal is desired, such as over the top portions of the wire loops. The metal is then deposited. The photoresist acts as a mask during the deposition step. The photoresist is stripped away, leaving metal only in the areas corresponding to the openings in the resist.

Also, the pad support element of the frame need not be in the form of a continuous rail extending around an aperture. For example, where the chip includes two rows of contacts disposed along two opposite edges of the chip, the pad support element can be provided as a pair of rails extending alongside these edges.

As these and other variations and combinations of the features discussed above can be employed, the foregoing description of the preferred embodiments should be taken by way of illustration rather than as limiting the invention as defined by the claims.

What is claimed is:

1. A semiconductor chip assembly, comprising:
   (a) a frame having a pad support element, said pad support element having a top surface and a plurality of bond pads disposed on the top surface;
   (b) a semiconductor chip disposed alongside said pad support element, said semiconductor chip having a first surface and a plurality of contacts disposed on the first surface,
   (c) a plurality of wire loops, wherein each wire loop has a contact end connected to one of the contacts, a bond pad end connected to one of the bond pads and a top portion between the contact end and the bond pad end; and
   (d) a compliant layer disposed over the first surface of the semiconductor chip and the plurality of wire loops such that the top portion of each wire loop is exposed.

2. The semiconductor chip assembly as claimed in claim 1, wherein said frame has an aperture and said pad support elements includes a rail enclosing said aperture.

3. The semiconductor chip assembly of claim 2, wherein the frame has a bottom surface opposite the top surface and the aperture extends from the top surface to the bottom surface.

4. The semiconductor chip assembly of claim 2, wherein the frame has a dielectric substrate layer underneath the aperture.

5. The semiconductor chip assembly of claim 1, wherein the compliant layer is comprised of a material selected from the group consisting of silicones and flexiblized epoxies.

6. The semiconductor chip assembly of claim 1, further comprising a plurality of joining units, wherein each joining unit is disposed over one of the wire loops and is comprised of an electrically conductive adhesive.

7. The semiconductor chip assembly of claim 1, wherein the compliant layer has a plurality of troughs and wherein each of the troughs is disposed over one of the wire loops.

8. The semiconductor chip assembly of claim 1, further comprising a plurality of solder balls, each of the solder balls being disposed within one of the plurality of troughs and wherein each trough is sized to hold one solder ball.

9. The semiconductor chip assembly of claim 1, further comprising a plurality of terminals, each of said terminals being associated with one of the wire loops and wherein the compliant layer has a primary surface, each of the terminals is disposed on the primary surface, and each of the terminals is electrically connected to the associated wire loop.

10. A semiconductor chip assembly, comprising:
    (a) a semiconductor chip having a first surface, a plurality of contacts disposed on the first surface, and a plurality of bond pads disposed on the first surface;
    (b) a plurality of wire loops, wherein each wire loop has a contact end connected to one of the contacts, a bond pad end connected to one said bond pad and a top portion between the contact end and the bond pad end; and
    (c) a compliant layer disposed over the first surface of the semiconductor chip and the plurality of wire loops such that the top portion of each wire loop is exposed.

11. The semiconductor chip assembly of claim 10, wherein the compliant layer is comprised of a material selected from the group consisting of silicones and flexiblized epoxies.

12. The semiconductor chip assembly of claim 10, further comprising a plurality of joining units, wherein each joining unit is disposed over one of the wire loops and is comprised of an electrically conductive adhesive.

13. The semiconductor chip assembly of claim 10, wherein the compliant layer has a plurality of troughs and wherein each of the troughs is disposed over one of the wire loops.

14. The semiconductor chip assembly of claim 10, further comprising a plurality of solder balls, each of the solder balls being disposed within one of the plurality of troughs and wherein each trough is sized to hold one solder ball.

15. The semiconductor chip assembly of claim 10, further comprising a plurality of terminals, each of said terminals being associated with one of the wire loops and wherein the compliant layer has a primary surface, each of the terminals is disposed on the primary surface, and each of the terminals is electrically connected to the associated wire loop.

16. A semiconductor chip assembly, comprising:
    (a) a semiconductor chip having a first surface and a plurality of contacts disposed on the first surface;

(b) a plurality of wire loops, wherein each wire loop has a first end connected to a contact, a second end connect to the same contact, and a top portion between the first end and the second end; and (c) a compliant layer disposed over the first surface of the semiconductor chip and the plurality of wire loops such that the top portion of each wire loop is exposed.

17. The semiconductor chip assembly of claim 16, wherein the compliant layer is comprised of a material selected from the group consisting of silicones and flexiblized epoxies.

18. The semiconductor chip assembly of claim 16, further comprising a plurality of joining units, wherein each joining unit is disposed over one of the wire loops and is comprised of an electrically conductive adhesive.

19. The semiconductor chip assembly of claim 16, wherein the compliant layer has a plurality of troughs and wherein each of the troughs is disposed over one of the wire loops.

20. The semiconductor chip assembly of claim 16, further comprising a plurality of solder balls, each of the solder balls being disposed within one of the plurality of troughs and wherein each trough is sized to hold one solder ball.

21. The semiconductor chip assembly of claim 16, further comprising a plurality of terminals, each of said terminals being associated with one of the wire loops and wherein the compliant layer has a primary surface, each of the terminals is disposed on the primary surface, and each of the terminals is electrically connected to the associated wire loop.

* * * * *

UNITED STATES PATENT AND TRADEMARK OFFICE
CERTIFICATE OF CORRECTION

| | | |
|---|---|---|
| PATENT NO. | : | 6,107,682 |
| DATED | : | August 22, 2000 |
| INVENTOR(S) | : | Fjelstad |

It is certified that error appears in the above-identified patent and that said Letters Patent is hereby corrected as shown below:

In the Abstract:
 line 2, "bonds" should read -- bond --.

Column 1, line 40, "number" should read -- numbers --.
Column 2, line 3, cancel the word "are" (first occurrence).
Column 2, line 32, before "1½" insert -- as --.
Column 2, line 33, before "known" insert -- a --.
Column 2, line 37, after "therefore" cancel the ",".
Column 3, line 12, after "having" insert -- a --.
Column 3, line 53, "loops" should read -- loop --.
Column 4, line 45, "are" should read -- is --.
Column 6, line 30, "fits" should read -- fit --.
Column 6, line 58, after "that" insert -- the --.
Column 9, line 13, cancel the word "are".
Column 10, line 17, after "end" insert -- , --.
Column 10, line 30, after "that" insert -- the --.
Column 12, line 3, "elements" should read -- element --.

Signed and Sealed this

Twenty-fourth Day of April, 2001

*Attest:*

NICHOLAS P. GODICI

*Attesting Officer*      *Acting Director of the United States Patent and Trademark Office*